United States Patent
Adduci et al.

(10) Patent No.: US 6,522,168 B2
(45) Date of Patent: Feb. 18, 2003

(54) INTERFACE LATCH FOR DATA LEVEL TRANSFER

(75) Inventors: Francesco Adduci, Milan (IT); Claudio Bona, Pieve Del Cairo (IT); Andrea Fassina, Milan (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/943,370

(22) Filed: Aug. 29, 2001

(65) Prior Publication Data

US 2002/0033712 A1 Mar. 21, 2002

(30) Foreign Application Priority Data

Aug. 31, 2000 (EP) .............................. 00830595

(51) Int. Cl.[7] .......................................... H03K 19/0175
(52) U.S. Cl. .............................. 326/81; 326/63; 326/14
(58) Field of Search .............................. 326/14, 80, 81, 326/63

(56) References Cited

U.S. PATENT DOCUMENTS

| | | | | |
|---|---|---|---|---|
| 5,422,523 A | * | 6/1995 | Roberts et al. | ................ 326/68 |
| 5,493,245 A | * | 2/1996 | Kao et al. | .................... 327/333 |
| 5,995,010 A | | 11/1999 | Blake et al. | ................. 340/653 |
| 6,040,708 A | * | 3/2000 | Blake et al. | .................. 326/33 |

* cited by examiner

Primary Examiner—Daniel D. Chang
(74) Attorney, Agent, or Firm—Lisa K. Jorgenson; E. Russell Tarleton; SEED IP Law Group PLLC

(57) ABSTRACT

An interface for translating data of different voltages includes an input terminal structured to accept an input from a circuit supplied by a power supply having a first voltage level, as well as an output terminal structured to provide an output from the interface a first circuit portion powered by a power supply having the first voltage level, a second circuit portion is powered by a power supply having a second voltage level, and a power supply detection circuit structured to accept a detection signal and to maintain a correct output at the output terminal even after the power supply having the first voltage level no longer supplies the first voltage level to the interface.

15 Claims, 3 Drawing Sheets

INTERFACE LATCH FOR DATA LEVEL TRANSFER

BACKGROUND OF THE INVENTION

1. Field of the Invention

The present invention is directed toward an interface latch for translating data from a first to a second supply voltage level, and more particularly to an transfer buffer interface latch having input and output terminals, and supplied with a first and a second voltage supply.

2. Description of the Related Art

In some integrated devices used in the audio radio field, it is very important to reduce the energy concentrated in a particular range of frequencies that could be propagated and could disturb other electronic applications. Even the clock switching in certain digital circuits could accumulate energy around the fundamental and harmonic frequency, which would result in decreased performance of the radio.

One solution to reduce this undesired effect is to reduce the power supply voltage in areas where the switching activity is higher. When using circuits with different power supplies, interfaces are useful to transmit data from circuits having a low voltage supply to circuits having a high voltage supply.

Generally, these interfaces use transfer level buffers able to convert logic states from low voltage to high voltage and vice-versa.

In some electronic devices the power supplies may not be constant, in that the specifications of the device may require that some power supplies are cleared during the work cycle. A difficult problem exists therefore in transferring data from a digital circuit having a low power supply to a digital circuit having a high power supply when the duty cycle of the low power supply is exceedingly short.

A general block diagram showing the process for switching logic levels between two supply voltages is seen in FIG. 1. A system 10 for switching includes a set of low-voltage logic 12 coupled to and providing an input to a transfer level buffer 14. The output of the transfer level buffer 14 is supplied to a high-voltage logic 16.

A more specific diagram showing an example of a transfer level buffer is shown in FIG. 2. This well-known transfer level buffer interface 20 for shifting data levels between two different supply voltages is used to convert data signals that have a low voltage supply to data signals that have a high voltage supply. The data signals for the high voltage supply is sometimes referred to as the voltage supply of the load. The data input to the transfer level buffer 20 will either be LOW (0 volts) or HIGH-3V (3 volts), while the output with either be LOW (0 volts) or HIGH-5V (5 volts). In this way, the data level of input circuitry having a 3 volt power supply is changed to the data level of the load circuitry having a 5 volt power supply.

In FIG. 2, a high supply 22 is a higher voltage supply than a low supply 24. A ground reference 26 is typically referenced at 0 volts. An input 30 accepts a data signal from the low supply circuitry, and an output 32 provides a data signal to the high supply circuitry.

The high supply 22 directly supplies two transistors, M5 and M6, which are coupled in turn to M4 and M7, respectively. Transistors M4, M5, M6 and M7 are all PMOS transistors. An NMOS transistor M2 is coupled between the transistor M7 and the ground 26. An input signal from the input 30 is connected directly to the gates of M7 and M2. Another NMOS transistor M0 is coupled between M4 and the ground 26. The output terminal 32 is placed between the transistors M4 and M0.

The low supply 24 supplies a PMOS transistor M3, which is coupled to an NMOS transistor M1, which is in turn coupled to the ground 26. The gates of the transistors M1 and M3 are linked together and to the input 30. The combination of M1 and M3 makes an inverter, with the inverter input being the signal on input 30, and the inverter output being the connection between the transistors M1 and M3. This inverter output is coupled to and drives the gates of M0 and M4.

The operation of the transfer level buffer 20 of FIG. 2 will now be discussed. When the signal on the input 30 is LOW, the gates of transistors M1, M2, M3, M6 and M7 are supplied with 0 volts. The gates of transistors M0 and M4 are set to voltage of the low supply 24 (Low supply voltage, or LSV) because the transistor M3 is ON, while the transistor M1 is off. M5 is set to the voltage of the high supply 22 (High supply voltage or HSV). Because of this biasing, M6 and M7, are both ON, and cause the transistor M5 to switch OFF. Because M0 is driven with the LSV, M0 is ON and ensures that the signal at the output 32 will be LOW. Therefore, when the signal on the input 30 is LOW, the signal on the output 32 of the transfer level buffer 20 is also LOW.

Conversely, when the signal on the input 30 is HIGH-LSV, which means it is at the voltage of the low supply 24, the gates of the gates of M1, M2, M3 and M7 are also driven with the LSV. The gates of M0, M4, and M5 are supplied with a LOW signal, while M6 is driven with the HSV. Because of this biasing, M4 and M5, are both ON, and M0 is OFF, which causes the output 32 to rise to HIGH-HSV, the level of the high supply 22. Thus, when the signal on the input 30 is HIGH-LSV, the signal on the output 32 of the transfer level buffer 20 is HIGH-HSV.

In this way, the transfer level buffer 20 provides at its output 32 voltage signals of 0 volts or 5 volts (or whatever the high supply 22 voltage is), while its input 30 accepts inputs of 0 volts or 3 volts (or whatever the low supply 24 voltage is).

One major problem with the transfer level buffer 20 is that it is unable to provide the proper signals at its output 32 if the low power supply 24 is removed. For instance, if the low supply 24 shut off because the electronic device that includes the transfer level buffer 20 required a short duty cycle of the low supply, there is no way to produce the necessary LOW and HIGH-HSV signals on the output 32 of the interface 20.

The underlying technical problem of this invention is to maintain an output at the transfer level buffer even when the low voltage supply switches off, thereby overcoming the limitations of prior art solutions for transfer level buffers.

BRIEF SUMMARY OF THE INVENTION

The disclosed embodiment of the present invention provides a particular latch architecture in the transfer level buffer, and an additional circuit portion that is operative when it receives a signal that indicates the low voltage supply has shut down.

In accordance with one embodiment of the invention, an interface for translating data of different voltages is provided. The interface includes an input terminal structured to accept an input from a circuit at a first voltage level; an output terminal structured to provide an output from the interface; a first circuit portion powered by a power supply generating the first voltage level; a second circuit portion powered by a power supply generating a second voltage level that is higher than the first voltage level; and a power supply detection circuit structured to accept a detection signal, the detection circuit coupled to the first and second circuit portions and further structured to maintain a correct output at the output terminal after the power supply generating the first voltage level no longer supplies the first voltage level.

In accordance with another embodiment of the invention, a method of translating data having a first data level to a second data level is provided. The method includes powering a first portion of a circuit with a power supply generating a first voltage operating level; powering a second portion of the circuit with a power supply generating a second voltage operating level; providing an input signal on an input terminal; generating an output at the second voltage operating level on an output terminal responsive to the input signal; and latching data from the input signal prior to interruption of the power supply having the first voltage operating levels to maintain the output at the second voltage operating level.

BRIEF DESCRIPTION OF THE DRAWINGS

The features and advantages of a device according to the invention will be apparent from the following description of an embodiment thereof, given by way of non-limitative example with reference to the accompanying drawings.

DETAILED DESCRIPTION OF THE INVENTION

The present invention is useful to convert digital data driven by buffers supplied by low voltage to digital data loads operating at a higher voltage, even when the low voltage supply is interruptible.

Figure 1:
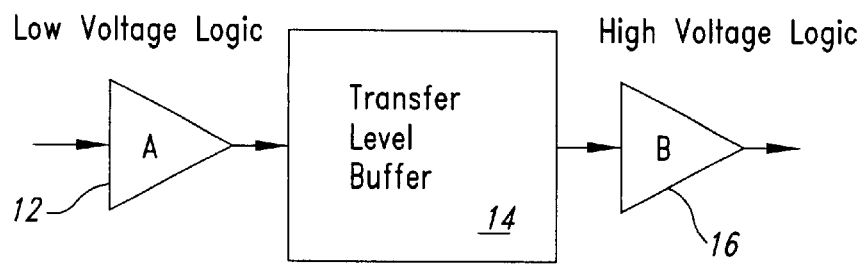
FIG. 1 is a general block diagram showing a transfer level device, along with its inputs and outputs according to the prior art.
Figure 3:
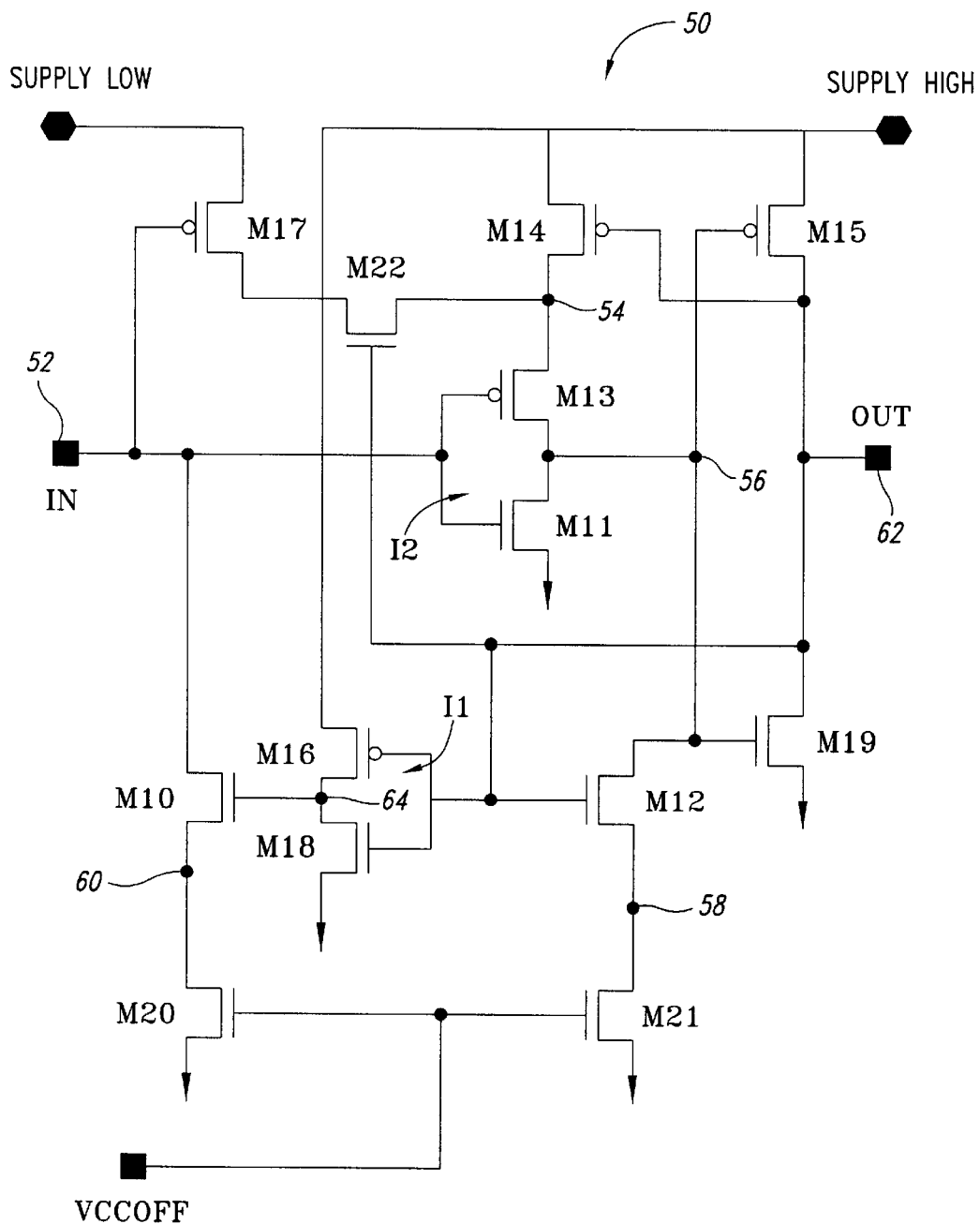
FIG. 3 is a schematic diagram showing a transfer data buffer latch embodying the invention.

With using the prior art transfer level buffer 14 of FIG. 1, if the low voltage logic 12 were to lose its voltage supply, the high voltage logic 16 would no longer continue to work correctly. However, with the use of the inventive transfer level buffer latch, the high voltage logic could continue to work because the data input to the inventive transfer level buffer latch is latched once it is received. This latching and data translating is due to the particular structure of the inventive transfer level buffer latch 50, shown in FIG. 3 and described below.

This transfer level buffer latch 50 is specifically tailored to convert 3 v logic to 5 v digital data, but could also be used in any application supplied by different voltage supplies other than those used in the present embodiment. The changing of supply voltages and other changes easily made by those skilled in the art to adapt the inventive circuit to other voltage levels is specifically considered part of the invention.

The transfer level buffer latch 50 includes a low voltage supply SUPPLYLOW, providing for example, 3 volts, and a high voltage supply SUPPLYHIGH, providing, for example 5 volts. It also includes an input terminal 52 for accepting either a LOW or a HIGH-LSV signal and an output terminal 62 for transmitting a LOW or a HIGH-HSV signal. There is also a ground reference, GND, which is typically referenced to 0 volts.

A signal VCCOFF is an indicator signal that could have a LOW logic level of 0 volts, or a HIGH logic level of either 3 v or 5 v. The signal VCCOFF signals the absence of the low voltage supply SUPPLYLOW. As used in the transfer level buffer latch 50, the signal VCCOFF has a HIGH logic signal if the SUPPLYLOW is not present, and a LOW logic signal if the SUPPLYLOW is present.

The transfer level buffer latch 50 includes a PMOS transistor M17 coupled directly to the SUPPLYLOW, which has a gate terminal driven by the input terminal 52.

Coupled directly to the SUPPLYHIGH are three PMOS transistors M14, M15 and M16. Drain terminals of the transistors M14 and M17 are coupled together by an NMOS transistor M22. The junction of the transistors M22 and M14 is labeled node 54. The gate of transistor M22 is coupled to the gate of a transistor M12, and both of these transistors M22, M12 are driven by the signal on the output 62. Additionally driven by the signal on the output 62 is an inverter I1, made from the PMOS transistor M16 and an NMOS transistor 18, which is coupled between M16 and ground, the operation of which will be further described below.

The drain terminal of the transistor M14 is also coupled to a PMOS transistor M13, which is in turn coupled to an NMOS transistor M11. A source of the transistor M11 is connected to ground. Control gates of the transistors M11 and M13 are coupled together and are driven by the signal on the input terminal 52. The combination of the PMOS transistor M13 and the NMOS transistor M11 makes a second inverter I2, driven by the signal on the input terminal 52, and having an output at a node 56.

The transistor M15 is coupled to ground through an NMOS transistors M19. The node 56 between the transistors M13 and M11 is coupled to the gates of the transistors M15 and M19 and provides the driving signals for them.. Placed between the drains of the transistors M15 and M19 is the output terminal 62.

A subcircuit for ensuring proper operation even if the low power supply is interrupted is formed of NMOS transistors M20 and M21 and a terminal for accepting the signal VCCOFF. The transistor M20 has its source coupled to ground and has its drain coupled to the input terminal 52 through an NMOS transistor M0. The gate of the transistor M10 is driven at a node 54, which is the output of the inverter I1. The transistor M21 has its drain coupled to the transistor M12, and also has its source coupled to ground. The signal VCCOFF, which goes HIGH when the low power supply is interrupted, drives both the control gates of both transistors M20 and M21.

The operation of the transfer level buffer latch 50 will now be discussed.

Operation as a Buffer When the Input is LOW

Figure 2:
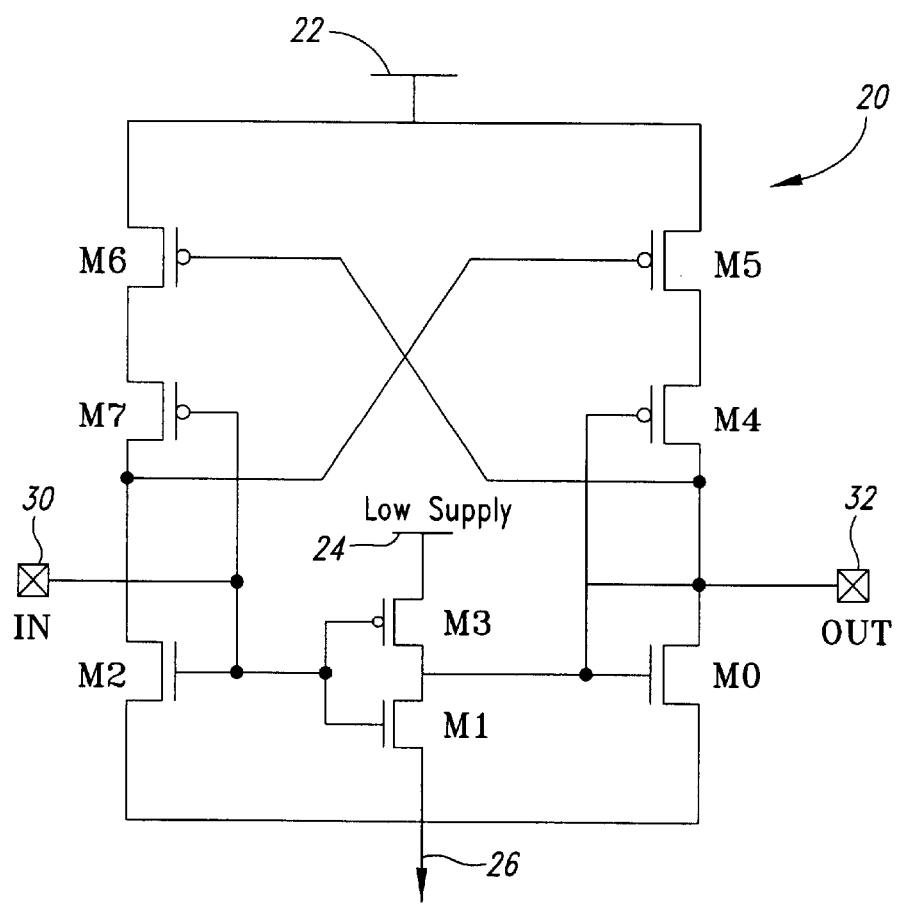
FIG. 2 is a schematic diagram showing in detail a transfer level device of the prior art.

When the SUPPLYLOW is 3 v and the SUPPLYHIGH is 5 v, the transfer level buffer latch 50 behaves like a buffer, having inputs and outputs similar to the interface 20 described above with reference to FIG. 2. This insures compatibility with circuits previously including the interface 20.

When the signal at the input terminal 52 is LOW, the NMOS transistor M11 is OFF and the PMOS transistors M13 and M17 are ON. To drive the output terminal 62 LOW, the transistor M19 must be ON while the transistor M15 is OFF.

If the last previous state of the output of the transfer level buffer latch 50 was LOW, M14 would still be ON, causing the node 56 to be coupled to SUPPLYHIGH through M13 and M14. Thus, the node 56 would turn the transistor M15 OFF and turn the transistor M19 ON, and thereby force the signal on the output 62 to LOW, the desired state when the signal on the input 52 is LOW.

If instead the previous state of the transfer level buffer latch 50 was HIGH-HSV, the NMOS transistor M22 would be ON, and the node 54 would be coupled to SUPPLYLOW through the transistors M17 and M22. Because the input signal at the input terminal 52 was LOW, the node 56, being at a voltage of SUPPLYLOW less the voltage drops through M17, M22 and M13, would still be high enough to reduce the driving capability of the PMOS M15 and turn the transistor M19 ON, and thereby force the signal on the output 62 to also be LOW. Further, the PMOS transistor M14, then driven by the LOW output on the output node 62 conducts and charges the node 54 to SUPPLYHIGH, which in turn is supplied through the transistor M13 to the node 56. Previously, node 56 was driven by SUPPLYLOW. This raises the gate voltage of transistor M15 and turns it definitely OFF.

Operation as a Buffer When the Input is HIGH

When the signal on the input terminal is HIGH-LSV, the NMOS transistor M11 is ON, while the PMOS transistors M13 and M17 are OFF. Because the node 56 would be LOW, the NMOS transistor M19 would be turned OFF while the PMOS transistor M15 would be turned ON. In this state M22 is ON, being coupled to SUPPLYHIGH through the transistor M15. Because M15 is on, while M19 is OFF, the signal on the output terminal 62 is necessarily HIGH-HSV.

Therefore, when a HIGH-LSV signal is presented on the input terminal 52, a HIGH-HSV signal will be generated on the output terminal 62.

A special feature exists in the transfer level buffer latch 50 in that, when the output is HIGH-HSV, the NMOS transistor M22 is turned ON. This leaves it ready to charge the node 54 as soon as the signal on the input terminal 52 goes LOW. This configuration allows transfer level buffer latch 50 to propagate signals faster than if it did not have this configuration.

Operation as a Latch When the Input is LOW

When the SUPPLYLOW is LOW, meaning that the low power supply has been interrupted, but the SUPPLYHIGH remains at 5 volts, transfer level buffer latch 50 behaves like a latch.

In the previous example, when the transfer level buffer latch 50 behaved as a buffer, that is, when the SUPPLYLOW is HIGH-LSV and when the signal input at the input terminal 52 is LOW, transistors M10, M13, M14, M16, M17 and M19 were ON and transistors M11, M15, M18, M12 and M22 were OFF. If the SUPPLYLOW then switches to LOW, that is the low power supply was interrupted, turned off or shut down, all of the connection signals maintain the previous values.

When the SUPPLYLOW is interrupted, the signal VCCOFF goes HIGH and the transistors M10 and M12 clamp their sources, which are nodes 60 and 58, respectively, to ground.

When the SUPPLYLOW is interrupted, while the output node 62 is LOW, the LOW signal present on the input node 52 is coupled to ground through M10 and M20. M10 is on because its gate at node 64 is coupled to the output of the inverter I1, which receives its input from the output node 62. Because the output node 62 is LOW, it forces the output of the inverter I1 HIGH, which drives the gate of M10 and turns it ON. M20 is on due to the presence of the HIGH signal VCCOFF. This configuration reduces the possibility of leakage through the path M14, M13 and M11, and also through the path M11 and M19. The transistor M12 is OFF and isolates node 56, which cannot be affected by any change on VCCOFF.

Thus, even when the SUPPLYLOW is interrupted or lost, transfer level buffer latch 50 can still produce a LOW output at the output node 62 when it receives a LOW signal on the input node 52.

Operation as a Latch When the Input is HIGH

When the transfer level buffer latch 50 behaved as a buffer and when the signal at the input terminal 52 is HIGH, transistors M11, M12, M15, M18, and M22 were ON, and transistors M10, M13, M14, M16, M17 and M19 were OFF. Now if SUPPLYLOW goes to LOW because it is shut down, all the connection signals maintain the previous values.

To maintain the HIGH-HSV signal at the output node 62, the transistor M15 must remain ON, while the transistor M19 must remain OFF; this entails driving both the gates of M15 and M19 LOW by keeping a LOW signal on node 56.

This condition is ensured by the operation of the transistor M21, driven HIGH by VCCOFF, and M12, driven HIGH by the output node 62. These transistors pull down the node 56 and couple it to ground. The transistor M22 is also ON because it is driven by the HIGH-HSV signal on the output node 62. Therefore, the node 56 is also coupled to the SUPPLYLOW, which is now 0 volts, through the transistors M17, M22 and M13. This configuration keeps node 56 LOW, and consequently keeps the signal on the output node at HIGH-HSV.

Thus, even when the SUPPLYLOW is interrupted or lost, the transfer level buffer latch 50 can still produce a HIGH output at the output node 62 when it receives a HIGH signal on the input node 52.

Figure 4A:
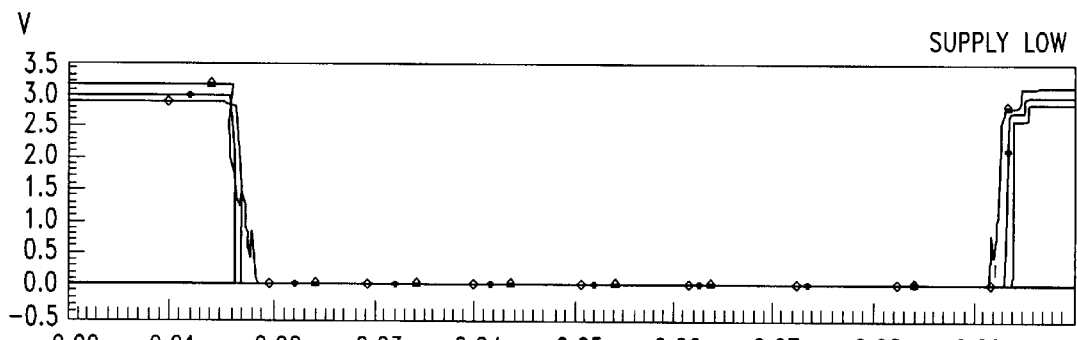
FIGS. 4A, 4B and 4C are charts showing various voltages at different times in a tested embodiment of the transfer data buffer latch of FIG. 3.
Figure 4B:
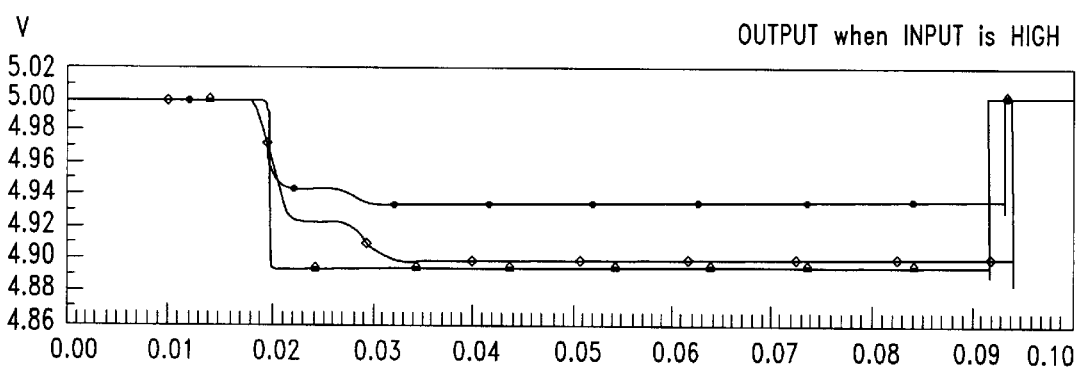
Figure 4C:
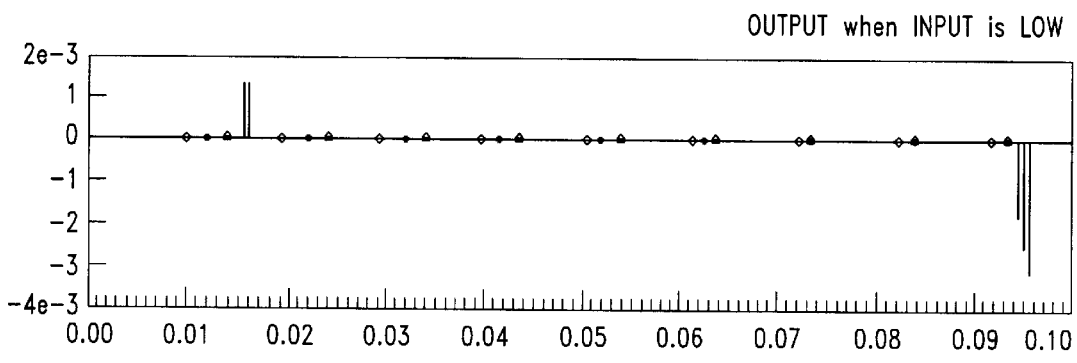

An embodiment of the transfer level buffer latch 50 was tested by the applicant, and the results shown in FIGS. 4A, 4B, and 4C. FIGS. 4A, 4B, and 4C are related graphs showing outputs of a simulated transfer level buffer latch 50, with different signals on the input node 52. FIG. 4A represents the voltage at the low voltage power supply, SUPPLYLOW. Three separate tests cases were run, all with similar results. Notice that, around 0.017 seconds, the SUPPLYLOW drops from 3 volts to 0 volts.

FIG. 4B shows the signal on the output node 62 of the transfer level buffer latch 50 when the signal on the input node is HIGH. In that case, once the SUPPLYLOW drops from 3 volts to 0 volts, the voltage on the output node 62 drops only slightly, from 5 volts to between 4.89 and 4.94 volts. Therefore, even when there is no low voltage power supply, the transfer level buffer latch 50 continues to provide the correct output. FIG. 4C shows, similarly, the signal on the output node 62 when the signal on the input node 26 is LOW. In this case, even when there is the SUPPLYLOW is removed, the transfer level buffer latch 50 continues to provide the correct output.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. An interface for translating data of different voltages, comprising:
   an input terminal structured to accept an input from a circuit supplied by a power supply having a first voltage level;
   an output terminal structured to provide an output from the interface;
   a circuit portion powered by a power supply having the first voltage level;
   a second circuit portion powered by a power supply having a second voltage level; and
   a power supply latch circuit structured to accept a detection signal, the latch circuit coupled to the first and second circuit portions and structured to maintain a current output at the output terminal even after the power supply having the first voltage level no longer supplies the first voltage level to the interface.

2. The interface of claim 1 wherein the power supply detection circuit comprises:
   a first NMOS transistor having a first conduction terminal coupled to the input terminal, a second conduction terminal coupled to the reference voltage, and being driven at a control terminal by the detection signal; and
   a second NMOS transistor having a first conduction terminal coupled to the output terminal, and having a second conduction terminal coupled to a first node in the interface, and being driven at a control terminal by the detection signal.

3. The interface of claim 2 wherein the second NMOS transistor is coupled to the first node through an additional transistor, and wherein the first NMOS transistor is coupled to the input terminal through a second additional transistor.

4. The interface of claim 1 wherein the circuit portion powered by the power supply having the first voltage level comprises:
   a first PMOS transistors having a source coupled to the power supply having the first voltage level and having a drain coupled to a circuit for connecting the circuit portion to the second circuit portion.

5. The interface of claim 4 wherein the second circuit portion comprises:
   a second and a third PMOS transistor having sources coupled to the power supply having the second voltage level, the drain of the second PMOS transistor coupled to a second node and the drain of the third PMOS transistor coupled to the output terminal;
   a series of a fourth PMOS transistor and a first NMOS transistor coupled between the second node and the reference voltage, the fourth PMOS transistor and the first NMOS transistor having the first node between them; and
   a second NMOS transistor, series coupled between the output terminal 62 and the reference voltage, wherein the third PMOS transistor and the second NMOS transistor are driven at gates by a signal at the first node.

6. The interface of claim 5, wherein the circuit for connecting the circuit portion to the second circuit portion comprises a third NMOS transistor coupling the first PMOS transistor and the second PMOS transistor between two conduction terminals, and driven at a control terminal by a signal on the output terminal.

7. A method of translating data having a first data level to a second data level comprising:
   powering a first portion of a circuit with a power supply having a first voltage operating level;
   powering a second portion of the circuit with a power supply having a second voltage operating level;
   providing an input signal on an input terminal;
   generating an output on an output terminal responsive to the input signal; and
   latching data from the input signal to maintain the output at a current state when the power supply having the first voltage operating level is interrupted.

8. The method of claim 7, comprising coupling the input terminal to a reference voltage when the power supply having the first voltage operating level is interrupted.

9. The method of claim 8, comprising creating a circuit path between the power supply having the first voltage operating level and a first node when the power supply having the first voltage operating level is interrupted, wherein the first node provides driving signals to control switching devices that generate the output signal.

10. The method of claim 7 wherein the first voltage operating level is 3 volts.

11. The method of claim 7 wherein, when interrupted, the power supply having the first voltage operating level drops from 3 volts to 0 volts.

12. An interface for translating data from a first voltage level to a higher second voltage level, comprising:
   a first circuit coupled to a power supply generating the first voltage level and configured to receive an input at the first voltage level;
   a second circuit powered by a power supply generating the higher second voltage level; and
   a power supply latch circuit configured to receive a detection signal, the latch circuit coupled to the first and second circuits and configured to latch data from the input to maintain the output from the interface at a current state when the first voltage level is interrupted.

13. An interface for translating data from a first voltage level to a higher second voltage level, comprising:
   a first circuit configured to receive the first voltage level from a first power supply and to receive at an input an input signal at the first voltage level;
   a second circuit coupled to the first circuit, the second circuit receiving a second voltage level from a second power supply that is higher than the first voltage level and to output an output signal at the second voltage level that is responsive to the input signal; and
   a power supply latch circuit coupled to the first and second circuits and configured to receive a detection signal when the first voltage level is no longer supplied and to maintain the output signal at the second voltage level when the first power supply no longer supplies the first voltage level, the power supply latch circuit comprising a first transistor having a first terminal coupled to the input of the first circuit, a second terminal coupled to a reference voltage, and a control terminal configured to receive the detection signal, and a second transistor having a first terminal coupled to an output terminal of the second circuit, a second terminal coupled to the reference voltage, and a control terminal configured to receive the detection signal.

14. An interface for translating data from a first voltage level to a voltage level that is higher than the first voltage level, comprising:
   a first circuit powered by the first voltage level and configured to accept an input signal at the first voltage level, the first circuit comprising a first PMOS transistor and a second PMOS transistor, each having their sources coupled to a first power supply generating the first voltage level, the drain of the first PMOS transistor coupled to a first node; and first and second NMOS transistors, series connected between the first node and a reference voltage; and an input coupled to the control terminal of the first and second PMOS transistors and to a first terminal of the first NMOS transistor;

a second circuit powered by the second voltage level, from the second circuit portion comprising a third and a fourth PMOS transistor having sources receiving the second voltage level, the drain of the third PMOS coupled to a second node and the drain of the fourth PMOS transistor coupled to an output terminal of the second circuit, a series of a fifth PMOS transistor and a third NMOS transistor coupled between the first node and the reference voltage, the fifth PMOS transistor and a third NMOS transistor having a third node between them, and a series of a fourth and a fifth NMOS transistor series coupled between the output terminal and the reference voltage, wherein the fourth PMOS transistor and the fourth NMOS transistor are driven at their respective gates by a signal at the third node; and a power supply latch circuit configured to receive a detection signal, the power supply latch circuit coupled to the first and second circuits and configured to maintain a current output at the output terminal of the second circuit when the first voltage level is no longer supplied, the power supply detection circuit comprising a first NMOS transistor having a first terminal coupled to the input of the first circuit, a second terminal coupled to a reference voltage, and a control terminal driven by the detection signal, and a second NMOS transistor having a first terminal coupled to the output of the second circuit and having a second terminal coupled to the reference voltage, and a control terminal driven by the detection signal.

15. The interface of claim 14, further comprising a sixth NMOS transistor coupling the first circuit and the second circuit between two conduction terminals and driven at a control terminal by a signal on the output of the second circuit.

* * * * *

UNITED STATES PATENT AND TRADEMARK OFFICE
CERTIFICATE OF CORRECTION

PATENT NO. : 6,522,168 B2
DATED : February 18, 2003
INVENTOR(S) : Francesco Adduci et al.

It is certified that error appears in the above-identified patent and that said Letters Patent is hereby corrected as shown below:

Column 8,
Line 62, "a voltage level" should read as -- a second voltage level --.

Signed and Sealed this

Twenty-ninth Day of July, 2003

JAMES E. ROGAN
*Director of the United States Patent and Trademark Office*